United States Patent
Liao et al.

(10) Patent No.: US 10,566,217 B2
(45) Date of Patent: Feb. 18, 2020

(54) DRYING APPARATUS

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Chih-Chieh Liao, Hsinchu (TW); Yu-Min Sun, Hsinchu (TW); Chih-Feng Cheng, Hsinchu (TW)

(73) Assignees: GLOBAL UNICHIP CORPORATION, Hsinchu (TW); TAIWAN SEMICONDUCTOR MANUFACTORING CO., LTD., Hsinchu (TW)

( * ) Notice: Subject to any disclaimer, the term of this patent is extended or adjusted under 35 U.S.C. 154(b) by 114 days.

(21) Appl. No.: 16/015,162

(22) Filed: Jun. 21, 2018

(65) Prior Publication Data
US 2019/0304810 A1    Oct. 3, 2019

(30) Foreign Application Priority Data
Mar. 27, 2018    (CN) .......................... 2018 1 0256039

(51) Int. Cl.
*F26B 3/34* (2006.01)
*H01L 21/67* (2006.01)
*F26B 5/04* (2006.01)
*F26B 5/00* (2006.01)
*F26B 3/04* (2006.01)

(52) U.S. Cl.
CPC .......... *H01L 21/67034* (2013.01); *F26B 3/04* (2013.01); *F26B 5/00* (2013.01); *F26B 5/04* (2013.01); *H01L 21/67109* (2013.01)

(58) Field of Classification Search
CPC ........ F26B 11/0495; F26B 3/04; F26B 3/347; F26B 5/00; F26B 5/04; H01L 21/67034; H01L 21/67109; H01L 21/6719
USPC ........................................... 34/263, 259, 248
See application file for complete search history.

(56) References Cited

U.S. PATENT DOCUMENTS

| | | | | |
|---|---|---|---|---|
| 5,237,755 A | * | 8/1993 | Lowe | F26B 3/347 34/255 |
| 5,820,820 A | * | 10/1998 | Pierce | A23L 3/40 422/22 |
| 2018/0043579 A1 | * | 2/2018 | Polato | B29C 35/0805 |
| 2019/0178575 A1 | * | 6/2019 | Heine | F26B 3/347 |

FOREIGN PATENT DOCUMENTS

| | | |
|---|---|---|
| JP | S5586116 A | 6/1980 |
| JP | H04115521 A | 4/1992 |
| TW | 201425847 A | 7/2014 |

* cited by examiner

*Primary Examiner* — John P McCormack
(74) *Attorney, Agent, or Firm* — CKC & Partners Co., LLC

(57) ABSTRACT

A drying apparatus includes an oven body, a magnetic field generating device, a chamber pressure controlling device and a baking device. The oven body is provided with a chamber which is air-hermetic for receiving a semiconductor package element. The chamber pressure controlling device reduces a chamber pressure of the chamber. The magnetic field generating device polarizes liquid on the semiconductor package element in the chamber. The baking device evaporates the liquid on the semiconductor package in the chamber.

10 Claims, 3 Drawing Sheets

US 10,566,217 B2

DRYING APPARATUS

RELATED APPLICATIONS

This application claims priority to China Application Serial Number 201810256039.8, filed Mar. 27, 2018, which is herein incorporated by reference.

BACKGROUND

Field of Disclosure

The present disclosure relates to a drying apparatus. More particularly, the present disclosure relates to a drying apparatus for drying semiconductor package elements.

Description of Related Art

In general, a conventional flip-chip packaged chip has good electrical conductivity and heat dissipating paths. However, after being fabricated, the conventional flip-chip packaged chip needs to be baked for a long period of time, so as to ensure the flip-chip packaged chip to meet the shipping requirements under proper drying conditions. For example, a high-end moisture-sensitive chip is required to be dried for at least 24 hours at a baking temperature of 125° C. continuously thus not only prolonging shipping cycle time and increasing manufacturing cost, but also further reducing industry competitiveness.

Therefore, there is a need for the industry to provide a method for developing a solution to effectively overcome the aforementioned inconvenience and disadvantages.

SUMMARY

According to one embodiment, a drying apparatus is provided. The drying apparatus includes an oven body, a magnetic field generating device, a chamber pressure controlling device and a baking device. The oven body has a chamber. The chamber is air-hermetic and may receive a semiconductor package element. The chamber pressure controlling device is connected to the chamber, and is used to reduce a chamber pressure of the chamber. The magnetic field generating device is connected to the chamber, and is used to polarize liquid on the semiconductor package element in the chamber. The baking device is connected to the chamber, and is used to heat to remove the liquid on the semiconductor package element in the chamber.

According to another embodiment, a drying apparatus is provided. The drying apparatus includes an oven body, a magnetic field generating device, a chamber pressure controlling device, a heater and an airflow guiding device. The oven body has a chamber. The chamber is air-hermetic, and may receive a semiconductor package element. The chamber pressure controlling device is connected to the chamber, and is used to reduce a chamber pressure of the chamber. The magnetic field generating device is connected to the chamber, and is used to surround the semiconductor package element to polarize the liquid of the semiconductor package element in the chamber. The heater is connected to the chamber, and is used to supply thermal energy to the chamber with the collaborative operation of the magnetic field generating device and the chamber pressure controlling device. The airflow guiding device is connected to the chamber, and is used to provide airflows to transfer the thermal energy from the heater to the liquid on the semiconductor package element for drying the semiconductor package element.

Thus, through the aforementioned structure of the embodiments above, one advantage of the disclosure is to accelerate the drying operation of the semiconductor package element, and shorten the baking time of the semiconductor package element. Therefore, not only the shipping cycle time and manufacturing cost can be reduced, but also the competitiveness of industry can be enhanced. In addition, another advantage of the disclosure is to save power energy and reduce energy costs.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. In the drawings.

DESCRIPTION OF THE EMBODIMENTS

Figure 1:
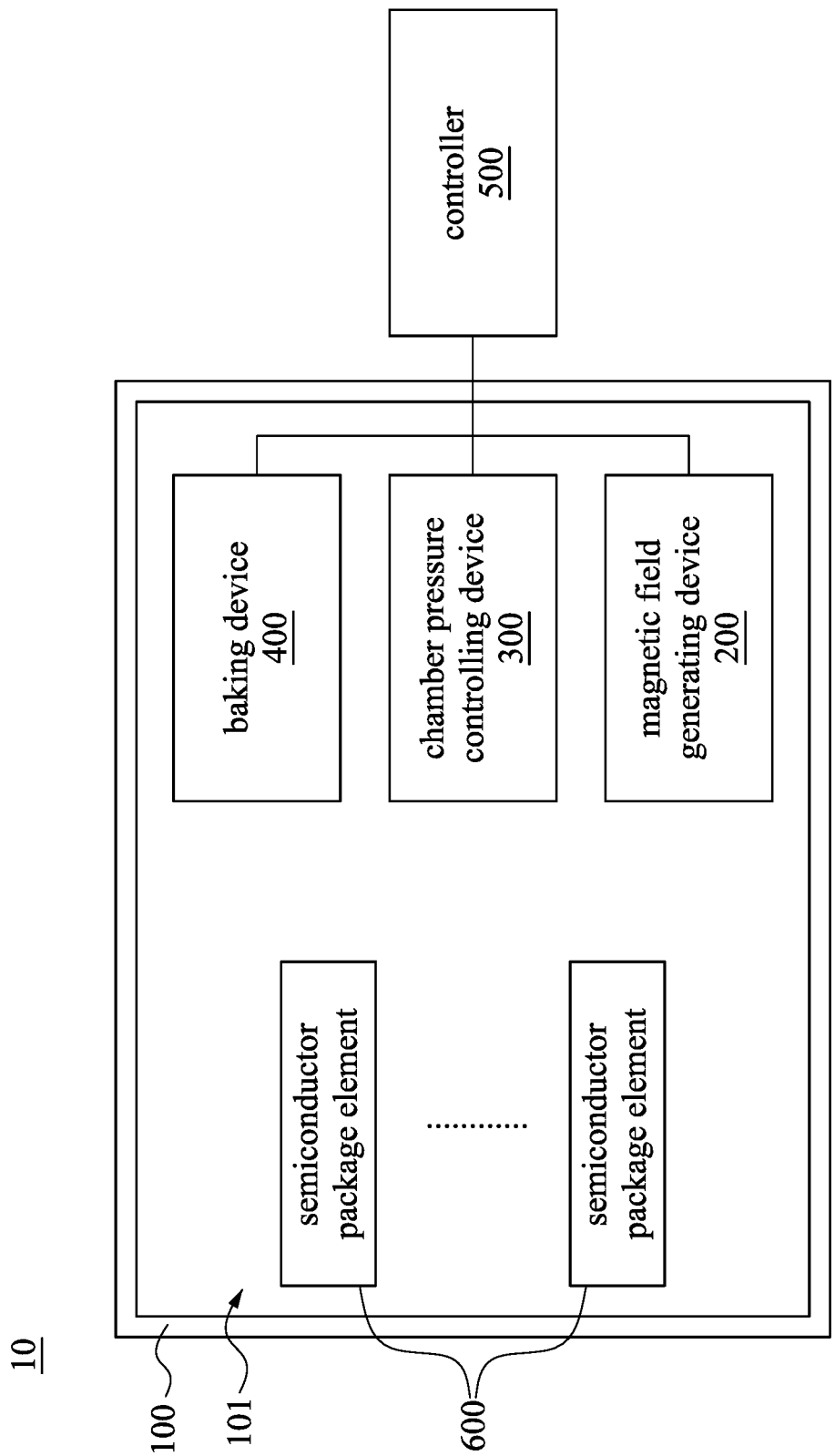
FIG. 1 is a schematic view of a drying apparatus according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Reference is now made to FIG. 1, in which FIG. 1 is a schematic view of a drying apparatus according to one embodiment of the present disclosure. As shown in FIG. 1, in the embodiment, the drying apparatus 10 includes an oven body 100, a magnetic field generating device 200, a chamber pressure controlling device 300 and a baking device 400. The oven body 100 is formed with a chamber 101 therein. The chamber 101 is hermetically sealed or air tight, and is configured to receive at least one semiconductor package element 600. The semiconductor package element 600 is, for example, a flip chip package wafer, a flip chip package wafer, or another similar electronic component. The chamber pressure controlling device 300 is connected to the chamber 101, and the chamber pressure controlling device 300 is used to reduce the chamber pressure of the chamber 101 (i.e., air pressure in chamber 101) for lowering the boiling point of the residual liquid (e.g., water) left on the semiconductor package element 600. The magnetic field generating device 200 is connected to the chamber 101, and is used to regulate the magnetic field in the chamber 101 to polarize the residual liquid (e.g., water) on the semiconductor package element 600 located in the chamber 101, such that that the group size of the water molecules of the residual liquid (e.g., water) and the diffusion coefficient of the residual liquid (e.g., water) can be reduced. The baking device 400 is connected to the chamber 101, and is used to heat to remove the liquid (e.g., water) on the semiconductor package element 600 in the chamber 101 thereby drying the semiconductor package element 600.

Thus, through the aforementioned structure of the embodiments above, the drying apparatus 10 in a baking process can provide a low-pressure magnetized environment within the chamber 101, such that the electromagnetic energy provided by the magnetic field generating device 200 may break the hydrogen bonds of the water molecules in the residual liquid (e.g., water) on the semiconductor package element 600, so as to reduce the group size of the water molecules of the residual liquid (e.g., water) and the diffusion coefficient of the residual liquid (e.g., water). The low chamber pressure of the chamber 101 controlled by the chamber pressure controlling device 300 can reduce the boiling point of the residual liquid (e.g., water) left on the semiconductor package element 600, increase the moisture evapotranspiration energy of the water molecules under a constant temperature, and improve the baking efficiency of the baking device 400. Therefore, the drying operation of the semiconductor package element 600 can be accelerated, and the baking time of the semiconductor package element 600 can be shortened, such that not only the shipping cycle time and manufacturing costs can be reduced, but also the competitiveness of the industry can be enhanced.

Compared with the baking time in the conventional baking operation, for example, the low chamber pressure mentioned above in the embodiment can increase the evaporation rate of the residual liquid (e.g., water) by 2 times, and the electromagnetic energy mentioned above in the embodiment can increase the evaporation rate of the residual liquid (e.g., water) by 1.8 times, respectively. Accordingly, the high-level moisture-sensitive chip only needs to be dried for 6-7 hours at a baking temperature of 125° C. continuously, such that the baking time is reduced to around 1/3.6 of the original baking time.

In addition, besides the object of time shortening, one with ordinary skills in the art of the disclosure also may aim at the object of energy saving in order to reduce energy cost, and even to avoid overheating and damaging the semiconductor package elements.

The magnetic field generating device 200, the chamber pressure controlling device 300 and the baking device 400 are respective electrically controllable devices. The drying apparatus 10 further includes a controller 500. The controller 500 is electrically connected to the magnetic field generating device 200, the chamber pressure controlling device 300, and the baking device 400 for performing the drying operation on the semiconductor package element 600 in the chamber 101 when the magnetic field generating device 200, the chamber pressure controlling device 300 and the baking device 400 are synchronously activated and regulated.

The magnetic field generating device 200 may be disposed in the oven body 100, in the chamber 101, or on the inner wall of the chamber 101, and may generate and transfer electromagnetic energy to the semiconductor package element 600, so as to break the structure of the water molecules in the residual liquid (e.g., water) on the semiconductor package element 600 for destabilizing the structure of the water molecules in the residual liquid (e.g., water) on the semiconductor package element 600, thus enhancing the mobility of the water molecules, thereby accelerating the drying operation to the semiconductor package element 600. The magnetic field generating device 200 polarizes the liquid on the semiconductor package element 600 in accordance with predetermined magnetic field intensity. For example, but not limited thereto, the predetermined magnetic field intensity is 1000 mGs, or 1000±30% mGs (i.e., 700-1300 mGs). Furthermore, the magnetic field generating device 200 is, for example, an electromagnet device or another similar device.

The baking device 400 radiates thermal energy to the semiconductor package element 600 in the chamber 101, and the baking device 400 heats and dries the semiconductor package element 600 in accordance with a predetermined temperature. For example, but not limited thereto, the predetermined temperature is 125° C.±25°, that is, the predetermined temperature is in a range between 100° C.-150° C. More specifically, the baking device 400 substantially heats and dries the semiconductor package element 600 in accordance with a constant temperature. For example, the constant temperature is approximately 125° C. or 150° C. However, the present disclosure is not limited thereto.

The chamber pressure control device 300 is used to regulate the chamber pressure of the chamber 101 to a non-vacuum pressure, such that air contained within the chamber 101 is able to transfer thermal energy to the semiconductor package element 600. More specifically, the chamber pressure control device 300 may regulate the chamber pressure within the chamber 101 to greater than 0 Atm and less than one atmosphere pressure (1 Atm). For example, but not limited thereto, the chamber pressure control device 300 may regulate the chamber pressure of the chamber 101 between 0.25 and 0.3 Atmosphere. A lower air pressure results in liquid (e.g., water) with a lower boiling point, and a fixed boiling point of the liquid (e.g., water) will promote evaporation momentum of the liquid (e.g., water). In addition, a lower air pressure environment also benefits evaporation. Thus, low-pressure baking in the oven can lower the boiling point of the water molecules, and the evapotranspiration of the water molecules can be improved under the constant baking temperature, so as to increase the baking efficiency.

It is noted that, the magnetic field generating device 200, the chamber pressure controlling device 300 and the baking device 400 on the oven body 100 respectively are not limited to specific configuration positions in the disclosure. In other embodiments, as long as the magnetic field generating device 200, the chamber pressure controlling device 300 and the baking device 400 can respectively work properly as mentioned above, one with ordinary skills in the art of the disclosure may change the configuration positions of the magnetic field generating device 200, the chamber pressure controlling device 300 and the baking device 400 on the oven body 100 according to any requirement or limitation.

Figure 2:
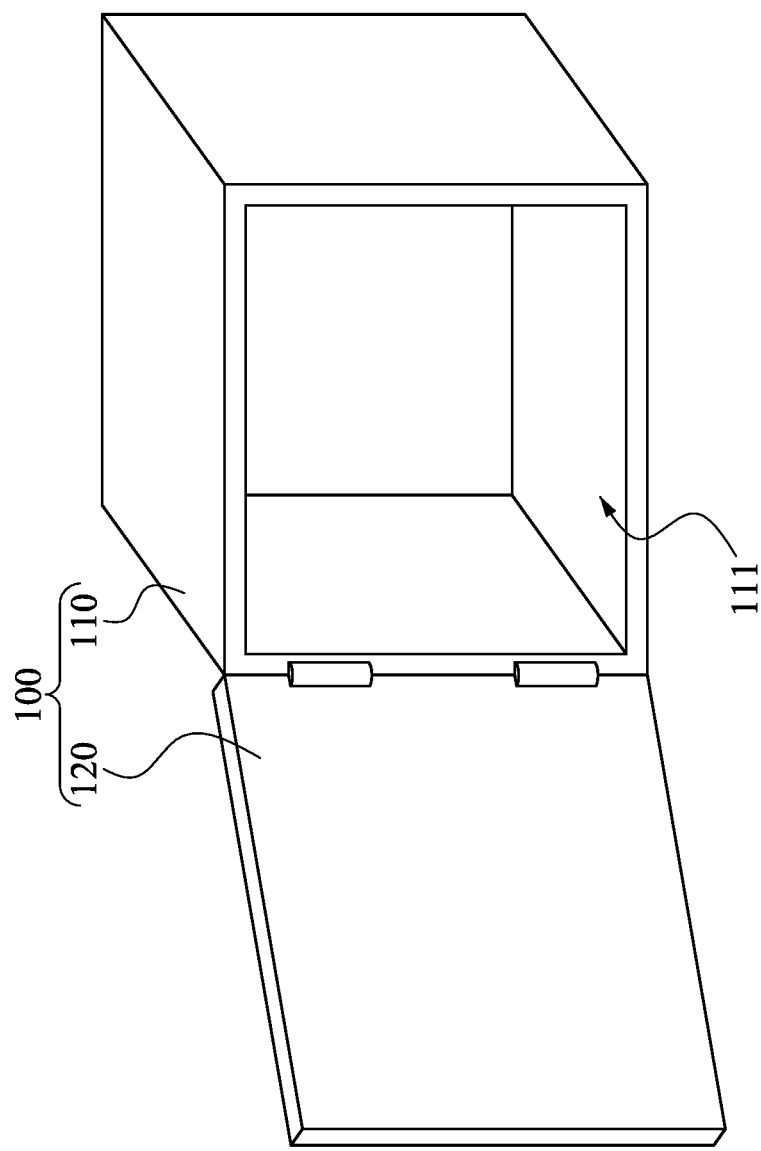
FIG. 2 is a schematic view of an oven body of a drying apparatus according to one embodiment of the present disclosure.

FIG. 2 is a schematic view of an oven body 100 of a drying apparatus 10 according to one embodiment of the present disclosure. As shown in FIG. 2, the oven body 100 of the drying apparatus 10 also includes a container 110 and a lid door 120. One surface of the container 110 is formed with an accommodating recess 111. The lid door 120 is movably connected to the container 110, such that the lid door 120 may hermetically cover the accommodating recess 111 of the container 110 to form the chamber 101 which is hermetically sealed or air tight as mentioned above in the oven body 100 for receiving the semiconductor package elements 600 (FIG. 1).

Figure 3:
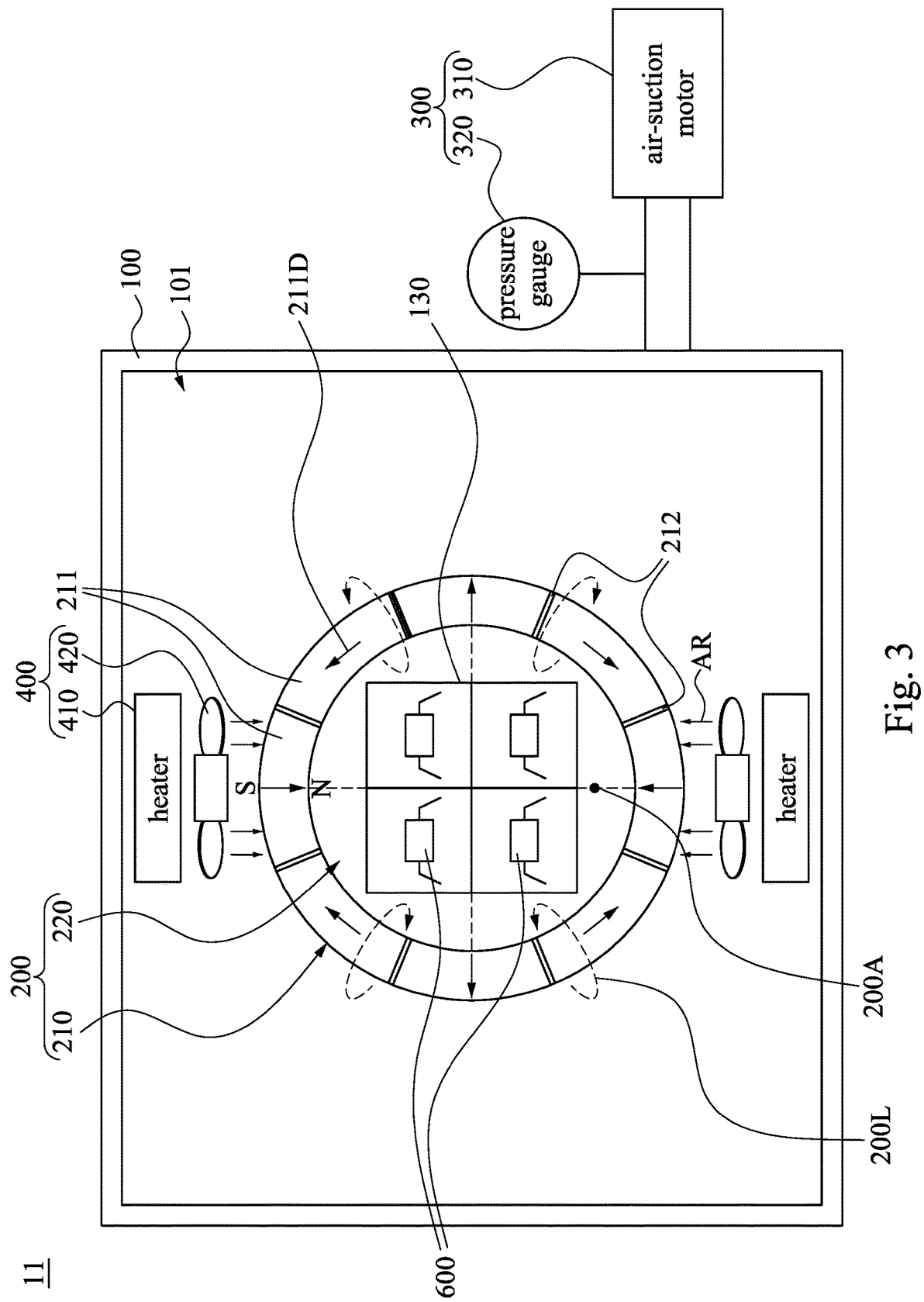
FIG. 3 is a schematic view of a drying apparatus according to one embodiment of the present disclosure.

FIG. 3 is a schematic view of a drying apparatus 11 according to one embodiment of the present disclosure. As shown in FIG. 3, the drying apparatus 11 of FIG. 3 and the drying apparatus 10 of FIG. 1 are substantially the same, in which the same elements are labeled with the same numerical references in FIG. 1 and FIG. 3. However, at least one difference of the drying apparatus 11 of FIG. 3 from the drying apparatus 10 of FIG. 1 is that, the magnetic field generating device 200 is not an electrically controllable device, and the magnetic field generating device 200 surrounds the semiconductor package element 600, and the magnetic field generating device 200 independently provides a predetermined magnetic field intensity to the chamber 101 and the semiconductor package element 600 in the chamber 101. For example, the predetermined magnetic field intensity is 1000 mGs, or 1000±30% mGs (i.e., 700-1300 mGs). In addition, the drying apparatus 11 further includes a frame 130. The frame 130 is removably arranged within the chamber 101 for placing plural semiconductor package elements 600.

For example, the magnetic field generating device 200 includes one or more magnetic tubular structures 210. The magnetic tubular structure 210 is disposed in the chamber 101 of the oven body 100, and the magnetic tubular structure 210 is formed by encircling with a number of magnetic elements 211 (e.g., eight magnetic elements 211 in FIG. 3) and silicon steel sheets 212 (e.g., eight silicon steel sheets 212 in FIG. 3). The magnetic elements 211 are collaboratively combined together, and each of silicon steel sheets 212 is sandwiched by two adjacent ones of the magnetic elements 211, such that every two adjacent ones of the magnetic elements 211 is physically separated from each other by one of the silicon steel sheets 212. Each of the silicon steel sheets 212 is, for example, a 3 mm high-magnetic permeability conductive silicon steel plate. The magnetic elements 211 of the magnetic tubular structure 210 collectively encircle to form a hollow space 220 for receiving the semiconductor package element 600 therein. The hollow space 220 is coaxial with the magnetic tubular structure 210, that is, the hollow space 220 and the magnetic tubular structure 210 have the same major axis direction 200A. The semiconductor package element 600 is received in the hollow space 220 for being polarized by the magnetic field generation device 200. The magnetic flux lines of the magnetic field intensity provided by the magnetic field generation device 200 form a high-efficient uniform magnetic field with low magnetic resistance in the geometric design of the magnetic tubular structure 210, so that the damage uniformity of the hydrogen bonds of the water molecules located at different positions of the semiconductor package element 600 can be increased. The round-shaped hollow space 220 is divided into four equal quadrants, and magnetic circuits 200L are provided in the respective equal quadrants independently. Accordingly, because the affective area of each magnetic element 211 is reduced, the adjustment of the geometry magnetic path can be controlled relatively easily.

Each magnetic element 211 is a permanent magnet that may be shaped as a curved tile. More specifically, because each magnetic element 211 is designed as a permanent magnet, no extra power is needed. Each magnetic element 211 is made of ferrite magnet ($BaFe_{12}O_{19}$), and the Curie temperature (Tc) is 469° C., and thus, the magnetic elements 211 are applicable to a high thermal-resistible baking environment. The magnetic flux lines of each of the magnetic elements 211 are in the form of a curved loop, so that each of the magnetic elements 211 has a shorter magnetic path compared to a conventional magnet whose magnetic flux lines are linear so as to reduce the magnetic loss. Each of the eight magnetic elements 211 has an S pole and a N pole. The indication directions of the magnetic flux lines 211D from the S pole to the N pole of each of the eight magnetic elements 211 are different to each other. The indication directions of the magnetic flux lines 211D from the S pole to the N pole of any two opposite magnetic elements 211 are opposite to each other. In other words, a magnetic-polarity arrangement of the eight magnetic elements 211 described above is arranged in accordance with a manner of Halbach Array for providing more even magnetic field distribution. Also, since the shape of each of the magnetic elements 211 is designed in a curved tile shape, each of the magnetic elements 211 has magnetic flux lines with relatively high density similar to a narrow tube effect for providing sufficient and uniform magnetic induction of the hollow space 220. Furthermore, when the magnetic tubular structures 210 are plural, these magnetic tubular structures 210 are connected in a single row to collectively surround the semiconductor package elements 600.

Also, in the embodiment, the baking device 400 includes one or more heaters 410 and airflow guiding devices 420. The heaters 410 can be hidden in the oven body 100 but not exposed to the chamber 101, or can be located in the oven body 100 to be exposed from the chamber 101. The heaters 410 can provide and transfer radiant thermal energy to the semiconductor package elements 600 in the chamber 101 through air convection inside the chamber 101. The heater 410 is, for example, a heating coil, a halogen heat lamp, or other similar device, but the present disclosure is not limited thereto. The airflow guiding devices 420 are connected to the chamber 101, and are used to accelerate the airflow AR with radiant thermal energy in the chamber 101. For example, the airflow guiding devices 420 such as fans, are symmetrically disposed within the chamber 101, and are respectively aligned with one of the heaters 410 so as to direct the output airflow AR with thermal energy to the liquid (e.g., water) of the semiconductor package element 600, so as to dry the semiconductor package elements 600. In other words, each of the airflow guiding devices 420 is disposed between the magnetic tubular structure 210 and one of the heaters 410. In other embodiments, each of the airflow guiding devices may also be arranged at a position in the chamber exactly facing to the hollow space of the magnetic field generating device.

In this embodiment, the chamber pressure controlling device 300 includes an air-suction motor 310 and a pressure gauge 320. The air-suction motor 310 is connected to the chamber 101 and controls chamber pressure by air pressure extraction. The pressure gauge 320 is connected to the air-suction motor 310 to provide current pressure data.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A drying apparatus, comprising:
an oven body having a chamber which is air-hermetic for receiving a semiconductor package element;

a chamber pressure controlling device that is connected to the chamber, and is configured to reduce a chamber pressure of the chamber;

a magnetic field generating device that is connected to the chamber, and is configured to polarize liquid on the semiconductor package element in the chamber; and a baking device that is connected to the chamber, and is configured to heat to remove the liquid on the semiconductor package element in the chamber.

2. The drying apparatus of claim 1, wherein the magnetic field generating device comprises:

a magnetic tubular structure disposed in the oven body, and formed by encircling with magnetic elements and silicon steel sheets, wherein the magnetic elements are collaboratively combined together, and each of the silicon steel sheets is sandwiched by two adjacent ones of the magnetic elements; and a hollow space is formed in the magnetic tubular structure and is surrounded by the magnetic elements for receiving the semiconductor package element.

3. The drying apparatus of claim 2, wherein each of the magnetic elements is a permanent magnet which is shaped as a curved tile.

4. The drying apparatus of claim 2, wherein the magnetic elements are arranged in accordance with a manner of Halbach Array.

5. The drying apparatus of claim 1, wherein the magnetic field generating device is configured to polarize the liquid on the semiconductor package element in accordance with a predetermined magnetic field intensity, wherein the predetermined magnetic field intensity is 1000±30% mGs.

6. The drying apparatus of claim 1, wherein the chamber pressure controlling device is configured to regulate the chamber pressure between 0 and 1 Atmosphere.

7. The drying apparatus of claim 1, wherein the chamber pressure controlling device is configured to regulate the chamber pressure to 0.25-0.3 Atmosphere.

8. The drying apparatus of claim 1, wherein the baking device dries the semiconductor package element in the chamber in accordance with a predetermined temperature, wherein the predetermined temperature is 125° C.±25°.

9. The drying apparatus of claim 1, wherein the baking device dries the semiconductor package element in the chamber in accordance with a constant temperature, wherein the constant temperature is 125° C. or 150° C.

10. A drying apparatus, comprising:

an oven body having a chamber which is air-hermetic for receiving a semiconductor package element;

a chamber pressure controlling device that is connected to the chamber, and is configured to reduce a chamber pressure of the chamber;

a magnetic field generating device that is connected to the chamber, and is configured to surround the semiconductor package element, so as to polarize liquid on the semiconductor package element in the chamber; and a heater that is connected to the chamber, and is configured to supply thermal energy to the chamber with an collaborative operation of the magnetic field generating device and the chamber pressure controlling device; and an airflow guiding device that is connected to the chamber, and is configured to provide airflows to transfer the thermal energy from the heater to the liquid on the semiconductor package element, thereby drying the semiconductor package element.

* * * * *